US009446944B2

(12) United States Patent
Ernst et al.

(10) Patent No.: US 9,446,944 B2
(45) Date of Patent: Sep. 20, 2016

(54) SENSOR APPARATUS AND METHOD FOR PRODUCING A SENSOR APPARATUS

(71) Applicant: Infineon Technologies AG, Neubiberg (DE)

(72) Inventors: Georg Ernst, Thalmassing (DE); Horst Theuss, Wenzenbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/693,902

(22) Filed: Apr. 23, 2015

(65) Prior Publication Data
US 2015/0307344 A1 Oct. 29, 2015

(30) Foreign Application Priority Data
Apr. 25, 2014 (DE) .......................... 10 2014 105 861

(51) Int. Cl.
*H01L 23/498* (2006.01)
*B81B 7/00* (2006.01)
*B81C 1/00* (2006.01)
(Continued)

(52) U.S. Cl.
CPC ............. *B81B 7/007* (2013.01); *B81B 7/0048* (2013.01); *B81C 1/00301* (2013.01); *G01L 19/0069* (2013.01); *G01L 19/0084* (2013.01); *H01L 23/49838* (2013.01); *B81B 2201/0264* (2013.01); *B81B 2207/098* (2013.01); *G01L 1/148* (2013.01); *G01L 1/16* (2013.01); *H01L 2224/16245* (2013.01); *H01L 2224/32225* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ..... H01L 23/057; H01L 23/16; H01L 23/18; H01L 23/49838; B81B 2201/0264; B81B 7/007; B81C 1/00301; G01L 1/148; G01L 1/16
USPC .................. 257/415; 73/448, 514.01, 514.34
See application file for complete search history.

(56) References Cited

U.S. PATENT DOCUMENTS 4,109,096 A * 8/1978 Dehaine .................. H01L 24/50
174/253
4,276,533 A * 6/1981 Tominaga ........... G01L 19/0038
338/4
(Continued)

FOREIGN PATENT DOCUMENTS

DE 102005046008 A1 3/2007
DE 102007010711 A1 9/2008
(Continued)

*Primary Examiner* — Earl Taylor
(74) *Attorney, Agent, or Firm* — Viering, Jentschura & Partner mbB

(57) ABSTRACT

In various embodiments, a sensor apparatus is provided. The sensor apparatus includes a sensor device having a plurality of electrical contacts; a housing having a plurality of sidewalls; and a metal carrier structure, which extends into the housing in a manner passing through two mutually opposite sidewalls from the plurality of sidewalls. The metal carrier structure is embodied in a resilient fashion at least in the direction of a sidewall through which the metal carrier structure extends. The sensor device having the plurality of electrical contacts is mounted in a resilient fashion on the metal carrier structure and is electrically conductively connected to the metal carrier structure by the plurality of contacts.

19 Claims, 6 Drawing Sheets

(51) Int. Cl.
  *G01L 19/00* (2006.01)
  *G01L 1/14* (2006.01)
  *G01L 1/16* (2006.01)

(56) References Cited

U.S. PATENT DOCUMENTS

| | | | | |
|---|---|---|---|---|
| 4,314,225 A * | 2/1982 | Tominaga | G01L 19/0084 | 228/262.9 |
| 4,831,212 A * | 5/1989 | Ogata | H01L 21/481 | 174/546 |
| 5,185,653 A * | 2/1993 | Switky | H01L 21/50 | 257/666 |
| 5,270,262 A * | 12/1993 | Switky | H01L 21/50 | 257/E21.499 |
| 5,317,107 A * | 5/1994 | Osorio | H01L 23/047 | 174/377 |
| 5,444,286 A * | 8/1995 | Ichihashi | G01L 19/0084 | 257/420 |
| 5,683,944 A * | 11/1997 | Joiner | H01L 23/49503 | 257/676 |
| 5,880,403 A * | 3/1999 | Czajkowski | H01L 23/055 | 174/387 |
| 6,037,662 A * | 3/2000 | Yoon | H01L 23/49572 | 257/666 |
| 6,049,120 A * | 4/2000 | Otani | G01L 19/141 | 257/414 |
| 6,159,764 A * | 12/2000 | Kinsman | H01L 23/4334 | 257/E23.092 |
| 6,215,175 B1 * | 4/2001 | Kinsman | H01L 23/49531 | 257/666 |
| 6,260,417 B1 * | 7/2001 | Watanabe | G01L 19/147 | 73/754 |
| 6,261,508 B1 * | 7/2001 | Featherby | H01L 23/055 | 257/E23.114 |
| 6,362,429 B1 * | 3/2002 | Moden | H01L 23/49572 | 174/94 R |
| 6,379,988 B1 * | 4/2002 | Peterson | B81C 1/00333 | 257/E21.502 |
| 6,393,922 B1 * | 5/2002 | Winterer | G01L 19/0084 | 73/754 |
| 6,435,414 B1 * | 8/2002 | Zafrany | G06K 19/07743 | 235/487 |
| 6,455,864 B1 * | 9/2002 | Featherby | H01L 23/055 | 250/515.1 |
| 6,512,255 B2 * | 1/2003 | Aoki | G01L 19/147 | 257/254 |
| 6,534,711 B1 * | 3/2003 | Pollack | H01L 23/057 | 174/529 |
| 6,680,525 B1 * | 1/2004 | Hsieh | H01L 27/14618 | 257/678 |
| 6,696,753 B2 * | 2/2004 | Tokuhara | H01L 23/13 | 257/666 |
| 6,720,493 B1 * | 4/2004 | Strobel | H01L 23/055 | 174/388 |
| 6,732,590 B1 * | 5/2004 | Gottlieb | G01L 19/147 | 73/754 |
| 6,925,885 B2 * | 8/2005 | Ishio | G01L 19/143 | 73/715 |
| 6,949,405 B2 * | 9/2005 | Hagen | G01L 19/141 | 257/415 |
| 7,216,545 B2 * | 5/2007 | Uchida | G01L 19/0627 | 73/705 |
| 7,391,101 B2 * | 6/2008 | Takahata | G01L 19/0084 | 257/672 |
| 7,464,603 B2 * | 12/2008 | Bauer | G01L 19/0069 | 257/678 |
| 7,732,915 B2 * | 6/2010 | Dangelmaier | B81B 7/0058 | 257/704 |
| 7,745,916 B2 * | 6/2010 | Theuss | C09J 9/00 | 257/678 |
| 7,749,797 B2 * | 7/2010 | Bauer | H01L 24/83 | 257/433 |
| 7,868,430 B2 * | 1/2011 | Paulus | H01L 24/83 | 257/668 |
| 8,344,497 B2 * | 1/2013 | Kim | H01L 23/3114 | 257/692 |
| 8,405,194 B2 * | 3/2013 | Nishihata | H01L 23/473 | 257/675 |
| 8,584,525 B2 * | 11/2013 | Offterdinger | B81B 7/0058 | 73/514.38 |
| 8,671,766 B2 * | 3/2014 | Sterling | H01L 23/04 | 73/700 |
| 8,742,559 B2 * | 6/2014 | Takahashi | H01L 21/50 | 257/419 |
| 2001/0028072 A1 * | 10/2001 | Aoki | G01L 19/147 | 257/254 |
| 2002/0050371 A1 * | 5/2002 | Czjakowski | G21F 1/08 | 174/360 |
| 2002/0180019 A1 * | 12/2002 | Saito | G01L 19/142 | 257/684 |
| 2003/0214026 A1 * | 11/2003 | Tokuhara | H01L 23/13 | 257/692 |
| 2004/0099933 A1 * | 5/2004 | Kimura | H01L 21/565 | 257/675 |
| 2004/0104458 A1 * | 6/2004 | Tsukada | G01L 19/141 | 257/669 |
| 2005/0016289 A1 * | 1/2005 | Saito | G01D 11/245 | 73/754 |
| 2007/0029657 A1 * | 2/2007 | Takahata | G01L 19/0084 | 257/680 |
| 2007/0034997 A1 * | 2/2007 | Bauer | H01L 23/49524 | 257/676 |
| 2007/0069354 A1 * | 3/2007 | Dangelmaier | B81B 7/0058 | 257/678 |
| 2007/0279845 A1 * | 12/2007 | Kuhnt | G01L 19/0645 | 361/679.01 |
| 2008/0122051 A1 * | 5/2008 | Theuss | C09J 9/00 | 257/678 |
| 2009/0026558 A1 * | 1/2009 | Bauer | H01L 24/83 | 257/414 |
| 2009/0026560 A1 * | 1/2009 | Wombacher | H01L 23/055 | 257/415 |
| 2009/0096071 A1 * | 4/2009 | Kim | H01L 23/3114 | 257/668 |
| 2009/0127697 A1 | 5/2009 | Pahl | | |
| 2009/0190319 A1 * | 7/2009 | Hatakeyama | B81B 7/0048 | 361/803 |
| 2010/0295140 A1 * | 11/2010 | Theuss | B82Y 25/00 | 257/421 |
| 2010/0327455 A1 * | 12/2010 | Nishihata | H01L 23/473 | 257/773 |
| 2011/0016981 A1 * | 1/2011 | Gebauer | G01L 19/0084 | 73/753 |
| 2012/0012949 A1 * | 1/2012 | Winkler | G01L 9/0054 | 257/415 |
| 2012/0106085 A1 * | 5/2012 | Yamazaki | G01J 5/029 | 361/705 |
| 2012/0235308 A1 * | 9/2012 | Takahashi | H01L 21/50 | 257/777 |
| 2012/0291559 A1 * | 11/2012 | Sterling | H01L 23/04 | 73/723 |
| 2013/0043575 A1 * | 2/2013 | Theuss | H01L 23/3107 | 257/676 |
| 2013/0152696 A1 * | 6/2013 | Kalz | B81B 7/02 | 73/777 |
| 2014/0008737 A1 * | 1/2014 | Koduri | G01P 15/0802 | 257/415 |
| 2014/0225240 A1 * | 8/2014 | Takahashi | H01L 21/50 | 257/667 |
| 2015/0090030 A1 * | 4/2015 | Theuss | G01D 11/245 | 73/431 |
| 2015/0307344 A1 * | 10/2015 | Ernst | B81B 7/007 | 257/417 |

FOREIGN PATENT DOCUMENTS

| | | |
|---|---|---|
| EP | 2040033 A1 | 3/2009 |
| JP | 04316340 A * | 11/1992 |
| WO | 2007045204 A1 | 4/2007 |

* cited by examiner

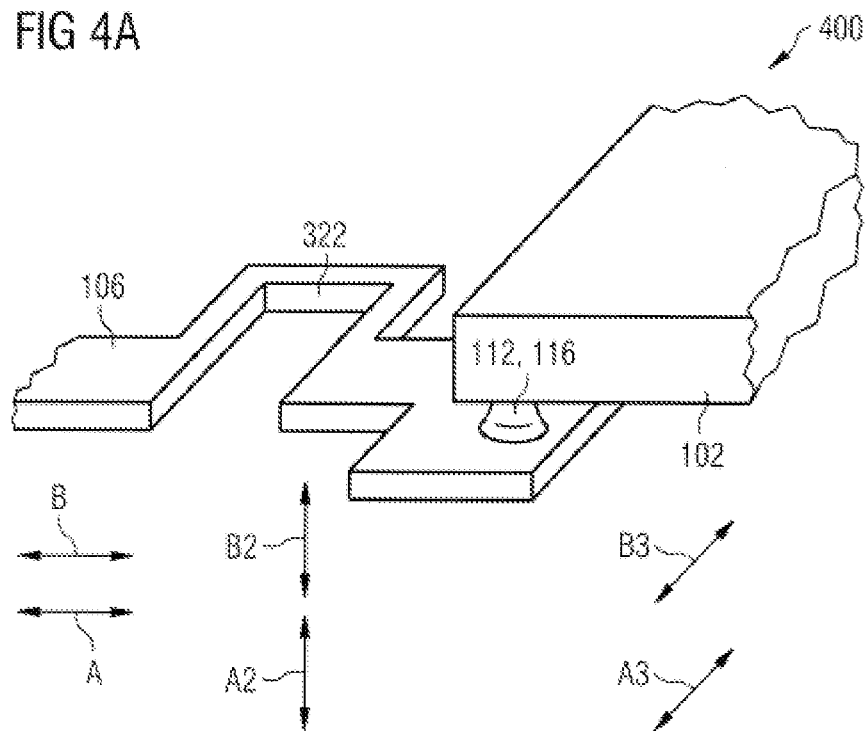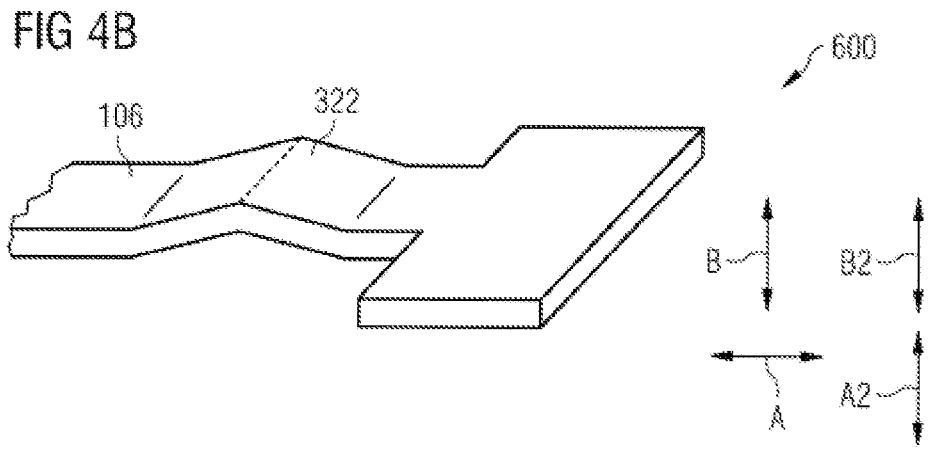

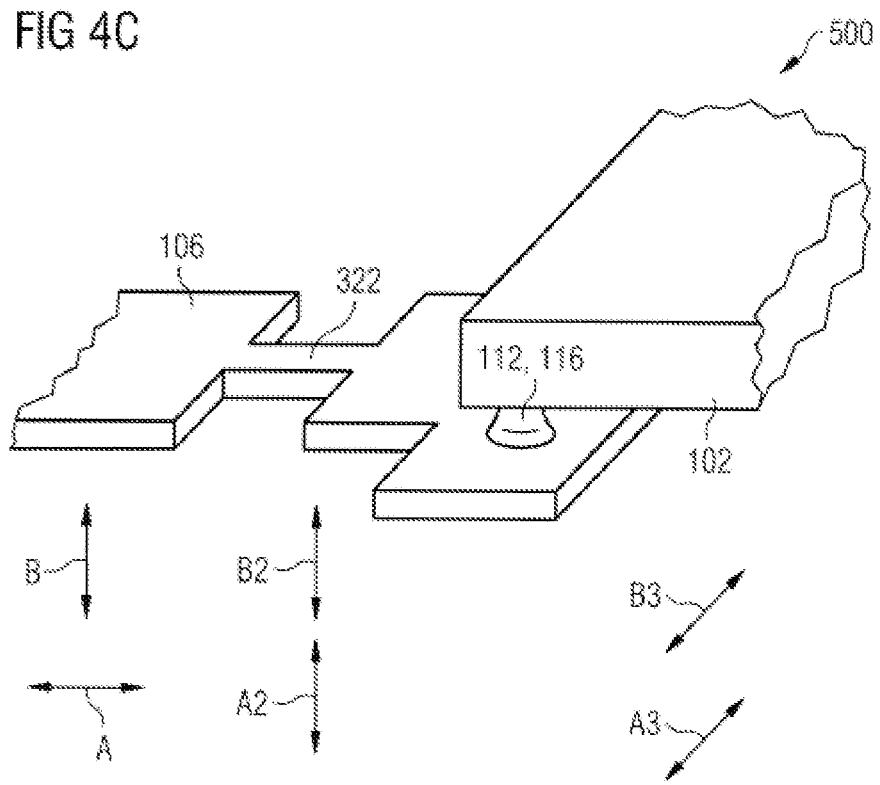

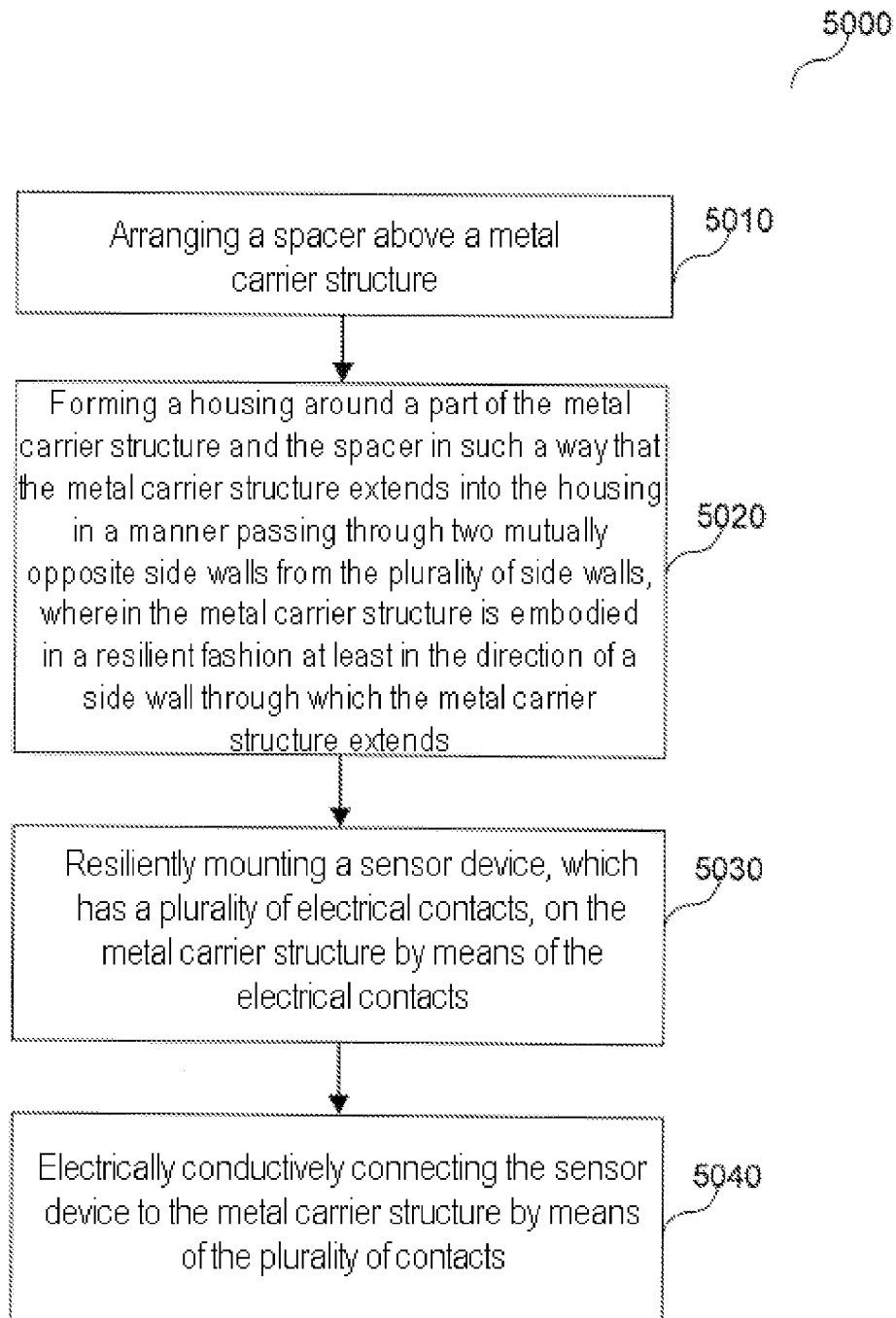

SENSOR APPARATUS AND METHOD FOR PRODUCING A SENSOR APPARATUS

CROSS-REFERENCE TO RELATED APPLICATION

This application claims priority to German Patent Application Serial No. 10 2014 105 861.5, which was filed Apr. 25, 2014, and is incorporated herein by reference in its entirety.

TECHNICAL FIELD

Various embodiments relate generally to a sensor apparatus based on a sensor device with integrated sensor arranged in a housing.

SUMMARY

In various embodiments, a sensor apparatus is provided. The sensor apparatus includes a sensor device having a plurality of electrical contacts; a housing having a plurality of sidewalls; and a metal carrier structure, which extends into the housing in a manner passing through two mutually opposite sidewalls from the plurality of sidewalls. The metal carrier structure is embodied in a resilient fashion at least in the direction of a sidewall through which the metal carrier structure extends. The sensor device having the plurality of electrical contacts is mounted in a resilient fashion on the metal carrier structure and is electrically conductively connected to the metal carrier structure by the plurality of contacts.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A to 4C show perspective detail views of the sensor apparatuses illustrated in FIG. 3A and FIG. 3C and of a further sensor apparatus; and FIG. 5 shows a flow chart illustrating a method for producing a sensor apparatus.

DESCRIPTION

Figure 1A:
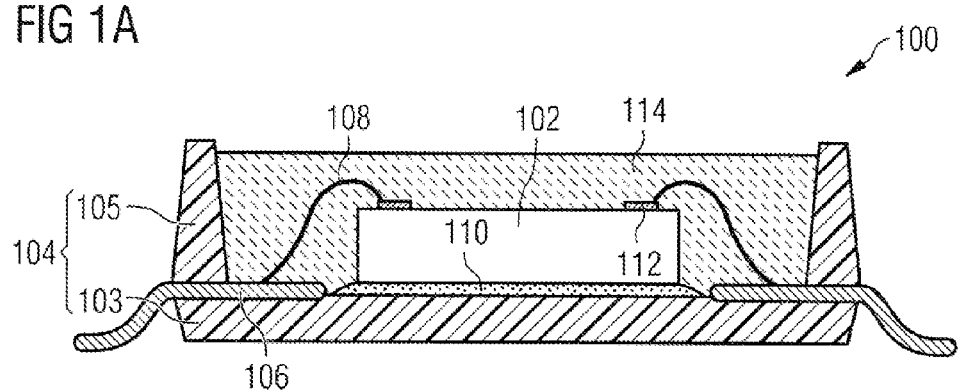
FIG. 1A shows a cross-sectional view of a sensor apparatus including a wire-bonded sensor chip.

The following detailed description refers to the accompanying drawings that show, by way of illustration, specific details and embodiments in which the invention may be practiced.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

A semiconductor chip can have a function; by way of example, a semiconductor chip can be fashioned such that it provides a sensor function, for example by a sensor which can be integrated in the semiconductor chip or fitted thereto. A semiconductor chip having an integrated sensor function can also be designated as a sensor chip or sensor device.

The sensor chip can be embodied such that it generates, detects and provides, for example evaluates and/or forwards, piezoelectric and/or capacitive signals. The sensor may include a pressure sensor or an acceleration sensor, for example.

A mechanical loading of the sensor chip, for example a mechanical stress in the sensor chip, which can cause e.g. bending of a membrane, a suspension or similar sensor structures can have the effect that piezoelectric and/or capacitive signals are generated which the sensor detects even though the piezoelectric and/or capacitive signals are not based on a state to be detected. To put it another way, the mechanical loading of the sensor chip can generate faulty signals (also designated as incorrect signals) which are detected by the sensor chip designed to detect electrical (e.g. piezoelectric and/or capacitive) signals. Consequently, the signals provided by the sensor chip can consist at least proportionally of an incorrect signal. An accuracy and a performance of the sensor chip can be impaired.

Furthermore, the sensor chip can detect a signal to be detected, for example a pressure to be measured, for example an ambient pressure, or an acceleration, which can generate a piezoelectric and/or capacitive signal.

The sensor chip should be mounted in the housing such that it is subjected to the fewest possible mechanical loadings.

FIG. 1A illustrates one exemplary arrangement of a sensor chip 102. The sensor chip 102 can be adhesively bonded on a base 103 of a housing 104 for example by an adhesive 110, for example by a soft, e.g. elastic, adhesive 110, for example a silicone adhesive 110. Owing to the elasticity of the adhesive 110, the sensor chip 102 can be mechanically decoupled from the housing 104, such that both the sensor chip 102 and the housing 104 can carry out a linear expansion owing to a temperature change, without exerting a force on the respective other part.

However, in the case of this arrangement it may be necessary to arrange the sensor chip 102 such that electrical contact 112 of the sensor chip 102 are arranged on a side facing away from the adhesive 110. As a result, it may be necessary to connect the electrical contacts 112 of the sensor chip 102 to a metal carrier structure 106 by wire bonding. The adhesive of the sensor chip 102 to the base 103 and the wire bonding constitute complex methods. Furthermore, a wire used for the wire bonding and locations at which said wire contacts the contacts 112 of the chip 102 and the metal carrier structure 106 have to be protected, for example against corrosion. The contact locations may include contact areas composed of aluminum, for example. For this purpose, by way of example, it is possible to utilize potting with a soft, for example an elastic, material 114, for example potting with silicone 114.

A similar arrangement (having the same disadvantages) can be utilized if the sensor, for example a pressure sensor, is arranged on a side of the sensor chip facing away from the contacts 112. The sensor chip 102 can then be arranged, e.g. adhesively bonded, above the base 103 of the housing 104 such that its sensor is arranged above an opening in the base 103. Here, too, the sensor chip 102 can be potted into an elastic material 114.

If potting with the elastic material 114 is dispensed with, the protection against corrosion should be ensured in some other way. That may be complex, particularly in the case of pressure sensors, in which a pressure inlet must be ensured.

In order to avoid wire bonding, the sensor chip 102 can be arranged in the housing 104 (see FIG. 1B) such that the electrical contacts 112 face the base 103 of the housing 104. Such an arrangement is also called a flip-chip arrangement. A contact between the metal carrier structure 106 and the contacts 112 of the chip 102 can be utilized both for a mounting of the sensor chip 102 on the metal carrier structure 106 and for the electrical contact between the contact 112 of the sensor chip 102 and the metal carrier structure 106, for example by virtue of the contacts 112 of the sensor chip 102 being adhesively bonded or soldered on the metal carrier structure 106, for example by a contact medium 116, for example a solder 116 or an electrically conductive adhesive 116. To put it another way, the sensor chip 102 can be mounted with its contacts 112 directly on the metal carrier structure 106, or more generally on a substrate.

However, the contact 112, the metal carrier structure 106 and the housing 104 are usually embodied such that the sensor chip 102, the metal structure 106 and the housing 104 cannot shift relative to one another in the event of a change in length owing to a temperature change. Consequently, a mechanical force can act on the sensor chip 102. The mechanical force can be exerted for example on an active area of the sensor chip 102, i.e. on an area of the sensor chip 102 in which at least one semiconductor component is embodied. As a result, a severe mechanical loading of the sensor may be brought about, and incorrect signals may be generated.

In various embodiments, a sensor chip of a sensor apparatus can be fitted as a flip-chip to a resilient metal carrier structure, for example a leadframe, in such a way that generation of incorrect sensor values in the event of a change in temperature of the sensor apparatus is reduced or avoided.

In various embodiments, a semiconductor chip can have a function; by way of example, a semiconductor chip can be fashioned such that it provides a sensor function, for example by a sensor which can be integrated in the semiconductor chip or fitted thereto. A semiconductor chip having an integrated sensor function can also be designated as a sensor chip or sensor device.

The sensor chip can be embodied such that it generates, detects and provides, for example evaluates and/or forwards, piezoelectric and/or capacitive signals. The sensor may include a pressure sensor or an acceleration sensor, for example.

In various embodiments, a high accuracy of the sensor can be achieved, even in the case of thermal and/or mechanical loading.

In various embodiments, the sensor chip can be mounted as a flip-chip in a manner virtually substantially free of stress, that is to say that strains, for example thermomechanical strains, hardly exert any forces on the sensor chip. This can be applicable for example to a state after the sensor chip has been mounted.

In various embodiments, the sensor chip can be mounted in such a way that a change in the temperature of the sensor apparatus does not generate any force directed at displacing or shifting the sensor chip relative to a medium surrounding it.

In various embodiments, the sensor chip may include a microelectromechanical system (MEMS), for example a microelectromechanical sensor, for example a pressure sensor.

In various embodiments, the sensor chip can be mounted as a flip-chip in a cavity; by way of example, it can be mounted in a cavity formed by a housing. The housing can be arranged around the metal carrier structure, for example the leadframe. The housing may include plastic, for example, which can be molded, for example injection-molded. Furthermore, the housing may include ceramic.

In various embodiments, the metal carrier structure may project into the cavity, e.g. into an inner region of the housing. The parts of the metal carrier structure which project into the cavity can provide electrical terminals for the sensor chip.

In various embodiments, the electrical terminals of the metal carrier structure can be embodied in a resilient fashion. To put it another way, they can be embodied such that they have spring properties. The electrical terminals of the metal carrier structure can be embodied such that they are compliant under low mechanical loading.

In various embodiments, the metal carrier structure can be embodied in a resilient fashion in the direction of longitudinal axes along which the electrical terminals extend into the interior from the respective sidewall through which they pass. To put it another way, the metal carrier structure can be embodied such that it acts in a resilient fashion at least along the longitudinal axes of the electrical terminals. To put it another way, the metal carrier structure can be embodied such that it is compliant under low mechanical loading along the longitudinal axis of a respective electrical terminal. The contact region between the sensor chip and the metal carrier structure can thus be embodied in a relatively freely movable fashion.

In various embodiments, the metal carrier structure can be embodied in a resilient fashion along at least one further direction, for example perpendicular to the longitudinal axis and substantially parallel to a base of the housing, or perpendicular to the longitudinal axis and substantially perpendicular to the base.

The sensor chip may include a plurality of electrical contacts. The plurality of electrical contacts can be connected to the electrical terminals of the metal carrier structure electrically, for example by soldering.

In various embodiments, the metal carrier structure can be embodied such that a resilient structure, i.e. a structure having spring action, is formed between the entry point of the electrical terminal into the cavity and the contact region of the electrical terminal with the contact of the sensor chip. The resilient structure can be embodied in a specific geometry, for example as a meandering shape or as a branching and recombining structure, to put it another way as a structure having an opening.

In various embodiments, the metal carrier structure can be embodied such that it extends into the cavity through two mutually opposite sidewalls. By a mounting of the sensor chip on the mutually opposite electrical terminals of the metal carrier structure, the sensor chip can be mounted such that a change in the temperature of the sensor apparatus does not generate any force directed at displacing the sensor chip relative to a medium surrounding it. In an illustrative description, in the event of a temperature change, as a result of a change in length of the electrical terminals of the metal carrier structure and of the sensor chip, a force is exerted on the sensor chip in the direction of the longitudinal axis of the electrical terminals. However, since a force in an opposite direction is exerted on the sensor chip from the opposite side, the two forces directed toward one another mutually cancel one another out, and a position of the sensor chip remains substantially unchanged.

In various embodiments, the housing and the metal carrier structure can be connected. The housing and the metal carrier structure can be connected by injection molding, for example.

In various embodiments, a spacer can be arranged above a partial region of the metal carrier structure before molding, for example injection molding, of the housing is carried out. The spacer can be arranged between an underside of the metal carrier structure, i.e. a side of the metal carrier structure facing a housing base to be formed, and the base to be formed. The spacer can make it possible to close an injection-molding mold prior to injection molding. In an illustrative description, the spacer can be utilized to form part of a mold for injection molding between the housing base to be formed and the resilient electrical terminals of the metal carrier structure. This enables the housing to be injection-molded, without the electrical terminals of the metal carrier structure being embedded into the base of the housing and/or bearing thereon and/or adhering thereto.

In various embodiments, the spacer can be embodied as a film on the underside of the metal carrier structure. The film may include a material which does not adhere to the material of the housing, even if it comes into contact with the liquefied material of the housing. The mold for injection molding can be embodied so as to result in a substantially planar inner surface of the base of the housing. The film on the underside of the metal carrier structure can have the effect that the electrical terminal of the metal carrier structure is movable relative to the base of the housing. The electrical terminals of the metal carrier structure can have the spring action at least in the direction of their longitudinal axis.

In various embodiments, the spacer can remain in the sensor apparatus after injection molding, provided that the electrical terminals of the metal carrier structure are movable relative to the base of the housing despite the spacer remaining. In other embodiments, the spacer can be removed.

In various embodiments, a filling material can be filled into the cavity. The filling material can be elastic, for example silicone or some other similar elastic material.

In various embodiments, a sensor apparatus is provided, including: a sensor device having a plurality of electrical contacts; a housing having a plurality of sidewalls; a metal carrier structure, which extends into the housing in a manner passing through two mutually opposite sidewalls from the plurality of sidewalls. The metal carrier structure can be embodied in a resilient fashion at least in the direction of a sidewall through which the metal carrier structure extends. The sensor device having the plurality of electrical contacts is mounted in a resilient fashion on the metal carrier structure and can be electrically conductively connected to the metal carrier structure by the plurality of contacts.

In one configuration, the metal carrier structure can be embodied in a resilient fashion by a meandering spring structure embodied in a plane of the metal carrier structure.

In another configuration, the metal carrier structure can be embodied in a resilient fashion by a spring structure embodied as an opening in a plane of the metal carrier structure.

In another configuration, the spring structure can be embodied between the respective sidewall and a respective contact region of the metal carrier structure with the electrical contact.

In another configuration, the sensor device may include a pressure sensor.

In another configuration, the sensor apparatus may furthermore include a filling material arranged such that it encapsulates the sensor.

In another configuration, the filling material can be elastic.

In another configuration, the filling material may include silicone or some other similar elastic material.

In another configuration, the housing can be molded, for example injection-molded.

In another configuration, the sensor apparatus may furthermore include a spacer. The spacer can be arranged between the metal carrier structure and a base surface of the housing.

In another configuration, the metal structure can be movable relative to the spacer.

In various embodiments, a method for producing a sensor apparatus is provided, including: arranging a spacer above a metal carrier structure; forming a housing around a part of the metal carrier structure and the spacer in such a way that the metal carrier structure extends into the housing in a manner passing through two mutually opposite sidewalls from the plurality of sidewalls. The metal carrier structure is embodied in a resilient fashion at least in the direction of a sidewall through which the metal carrier structure extends; resiliently mounting a sensor device, which has a plurality of electrical contacts, on the metal carrier structure by the electrical contacts. The method may further include electrically conductively connecting the sensor device to the metal carrier structure by the plurality of contacts.

In another configuration, forming the housing may include molding, for example injection molding.

In another configuration, the method may furthermore include removing the spacer.

In another configuration, the method may furthermore include arranging a filling material.

In another configuration, arranging the filling material may include introducing liquid silicone or some other similar elastic material by filling.

In another configuration, electrically conductively connecting the sensor device to the metal carrier structure may include soldering the plurality of contacts onto the metal carrier structure.

Figure 2A:
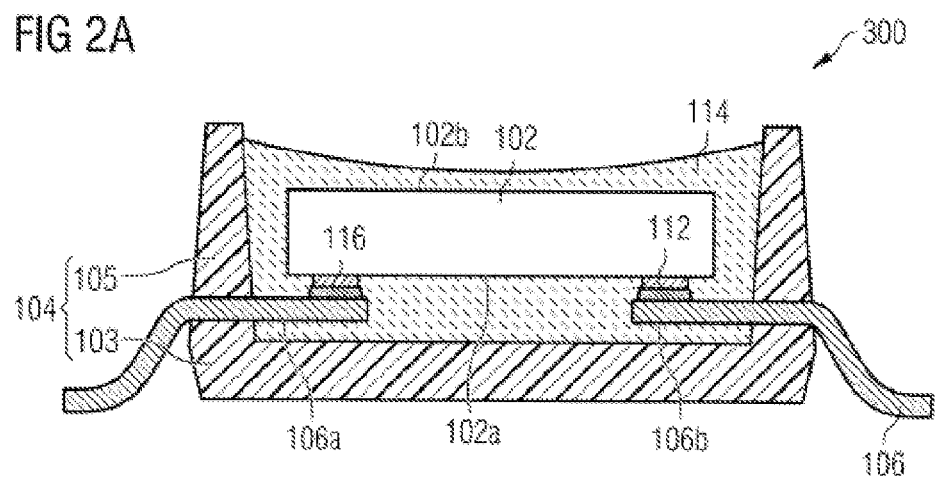
FIGS. 2A and 2B show cross-sectional views of sensor apparatuses in accordance with various embodiments.
Figure 2B:
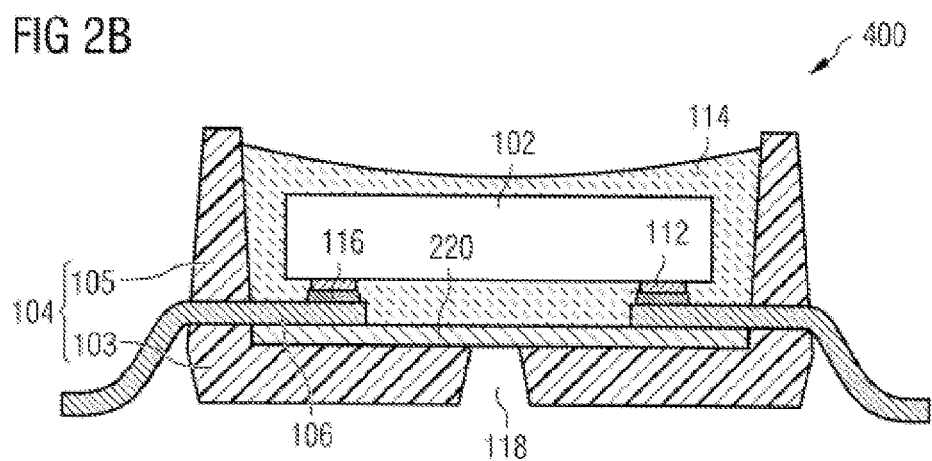

FIG. 2A and FIG. 2B show cross-sectional views of sensor apparatuses 300, 400 in accordance with various embodiments.

In various embodiments illustrated in FIG. 2A, the sensor apparatus 300 may include a sensor device 102, also designated as sensor chip 102. The sensor device 102 may include or may essentially consist of a chip, for example a silicon chip. The sensor device 102 can have two main surfaces 102a, 102b.

In various embodiments, the sensor device 102 may include a sensor designed to detect a state, for example a pressure, for example a static pressure or a pressure change, or an acceleration. The sensor device may include a microelectromechanical system (MEMS) as sensor. In an MEMS, it is possible to realize a movable part on a chip, for example a membrane that can be utilized for static and/or dynamic pressure measurements, for example. The electrical measurement can in this case take place in a capacitive or piezoresistive manner, for example. The sensor can be integrated into the sensor chip 102.

In various embodiments, the sensor device 102 may include a sensor designed to detect a signal which is to be detected by a relative movement between the sensor device 102 and a housing 104 of the sensor apparatus 300, 400. By way of example, one part of a capacitor can be embodied in the sensor in the sensor device 102, a second part of the capacitor can be embodied in or on an inner side of a wall of the housing 104, and a signal, for example a change in the capacitance, can be generated in the sensor if the sensor device changes its position relative to the housing, for example owing to an acceleration of the sensor apparatus or owing to a pressure change.

In various embodiments, the sensor apparatus may include the housing 104. The housing 104 can have a base 103 and a plurality of sidewalls 105.

In various embodiments, the base 103, as illustrated in FIG. 2A, can be embodied in a continuous fashion. It can form for example a continuous surface without an opening. In other embodiments, the base 103, as illustrated in FIG. 2B, can have an opening 118. The opening can be arranged in the base, for example, if the sensor in the sensor chip 102 is arranged on the main surface 102a of the sensor chip 102 facing the base 103.

In various embodiments, the sidewalls 105 can be connected to the base 103. The sidewalls 105 can be arranged for instance at a right angle with respect to the base 103. The sidewalls 105 can be arranged opposite one another in pairs. By way of example, four sidewalls 105 can be arranged such that they enclose between them a parallelepipedal or cubic space, also designated as the interior of the housing 104 (for short: interior) or as cavity. The sidewalls 105 can be connected to one another such that they form a ring-shaped and/or a frame-shaped structure. The base 103 can be arranged at an end face of the ring- and/or frame-shaped structure. The housing can furthermore have a cover (not illustrated). The cover can be arranged at a second end face of the ring- and/or frame-shaped structure.

The housing 104 may include or may essentially consist of a plastic. The plastic can be for example a polymer, for example a thermosetting plastic or a thermoplastic.

Furthermore, the housing 104 can be injection-molded.

The housing 104 may include or may essentially consist of ceramic.

The base 103 and the sidewalls 105 can be formed simultaneously, for example can be formed by plastic injection molding or by casting of a ceramic composition into a mold.

In various embodiments, the sensor apparatus 300, 400 may include a metal carrier structure 106. The metal carrier structure 106 may include or be formed from a metal, for example copper or a copper alloy.

In various embodiments, the metal carrier structure 106 can be a so-called leadframe, a connection frame for chips that is produced at least partly from a solderable metal.

In various embodiments, the metal carrier structure 106 can be shaped and arranged during the process of forming the housing 104 such that parts 106a, 106b of the metal carrier structure 106 extend into the interior of the housing 104. To put it another way, the metal carrier structure 106 and the housing 104 can be connected to one another, for example during the process of forming the housing 104, for example by virtue of the metal carrier structure 106 extending through the sidewalls 105.

In various embodiments, the parts 106a, 106b of the metal carrier structure can extend into the interior at least through two mutually opposite sidewalls 105.

In various embodiments, the parts 106a, 106b of the metal carrier structure 106 which project into the cavity can provide electrical terminals 106a, 106b for the sensor device 102.

In various embodiments, the electrical terminals 106a, 106b can be provided in pairs. To put it another way, the same number of electrical terminals 106a and of electrical terminals 106b can be provided. To put it another way, an even number of electrical terminals 106a, 106b can be provided, wherein one half 106a of the electrical terminals 106a, 106b extends into the interior of the housing 104 through one sidewall 105 of the mutually opposite sidewalls 105, and a second half 106b extends into the interior of the housing 104 through the other sidewall 105 of the mutually opposite sidewalls 105.

In various embodiments, the electrical terminals 106a, 106b of the metal carrier structure 106 can be embodied in a resilient fashion. To put it another way, they can be embodied such that they have spring properties. The electrical terminals 106a, 106b of the metal carrier structure 106 can be embodied such that they are compliant under low mechanical loading.

The electrical terminals 106a, 106b (for short: terminals) of the metal carrier structure 106 can each have a longitudinal axis. The longitudinal axis can extend in a direction determined by an entry point or a midpoint of an entry surface of the terminal 106a or 106b at which the terminal 106a or 106b enters the cavity and a midpoint of an end face of an end—arranged in the cavity—of the terminal 106a or 106b in the cavity. Expressed in an illustrative way, each terminal extends along its longitudinal axis into the interior from the sidewall 105 through which it passes.

The sensor chip 102 may include a plurality of electrical contacts 112.

The plurality of electrical contacts 112 can be connected to the electrical terminals 106a, 106b of the metal carrier structure 106 electrically, for example by soldering. The sensor device 102 can be mechanically connected to the electrical terminals 106a, 106b of the metal carrier structure 106 by the electrical connection between the electrical contacts 112 and the electrical terminals 106a, 106b. By way of example, the sensor chip 102 can be fixed to the electrical terminals 106a, 106b of the metal carrier structure 106 by its electrical contacts 112. A region in which the electrical contact 112 contacts the electrical terminal 106a or 106b (e.g. electrically and physically) can be designated as a contact region.

The metal carrier structure 106 can be embodied in a resilient fashion along the longitudinal axes of the electrical terminals 106a, 106b. To put it another way, the metal carrier structure 106 can be embodied such that it acts in a resilient fashion at least along the longitudinal axes of the electrical terminals 106a, 106b. To put it another way, the metal carrier structure 106 can be embodied such that it is compliant under low mechanical loading along the longitudinal axis of a respective electrical terminal 106a, 106b. The contact region between the sensor chip and the metal carrier structure can thus be embodied in a relatively freely movable fashion in the direction of the longitudinal axis.

A change in the temperature of the sensor apparatus 300, 400 can bring about a change in length (or a change in size, since the change in length does not just take place in the direction of the largest extent of a component, but rather in all directions; however, the term change in length is used for simplification) of all the components. Typically, an extent of the change in length is dependent on a material or a material composition of the component and is characterized by a coefficient of thermal expansion. Most materials expand as the temperature increases (they have a positive coefficient of expansion), but there are also materials which contract as the temperature increases (negative coefficient of expansion).

In various embodiments, a difference in materials that the various parts of the sensor apparatus 300, 400 (e.g. the housing 104, the sensor chip 102, the metal carrier structure 106) include can have the effect that the parts change their respective length to different extents in the event of a change in the temperature of at least parts of the sensor apparatus 300, 400 (for example as a result of heating of the sensor chip 102 during its use or as a result of a change in an ambient temperature).

By way of example, if the sensor chip 102 would heat up owing to its use, it would expand, inter alia substantially parallel to its two main surfaces 102a, 102b, while the metal carrier structure 106 and the housing 104 would substantially maintain their length. Other temperature change patterns can lead to other changes in length. As a result of the different changes in length in a mounting assembly which may include the sensor chip 102 and e.g. the metal carrier structure 106 and the housing 104, if the sensor chip 102 were not mounted in a resilient fashion as illustrated in FIG. 1B, by the mechanical connection between the contacts 112 of the sensor chip 102 and the electrical terminals 106a, 106b of the metal carrier structure 106, a force could be exerted on the sensor chip 102, which force could cause an incorrect signal.

In various embodiments, this can be reduced or prevented, however, by the terminals 106a, 106b embodied in a resilient fashion. The resilient terminals 106a, 106b can deform, for example elastically. To put it another way, the force which would have brought about a strain for example in the case of the sensor chip 102 mounted in accordance with FIG. 1B can bring about a deformation of the terminal 106a, 106b in the case of the sensor chip 102 mounted in accordance with FIG. 2A or FIG. 2B. As a result, it can be possible for the sensor chip 102 to carry out its change in length without a stress, for example a tensile stress or a compressive stress, occurring in the sensor chip 102.

Figure 1B:
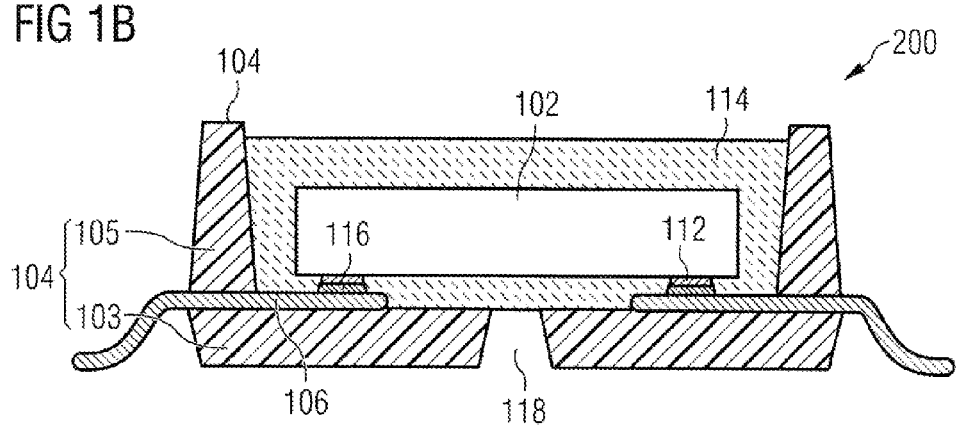
FIG. 1B shows a cross-sectional view of a sensor apparatus including a flip-chip-bonded sensor chip.

In the sensor chip 102 mounted in accordance with FIG. 1B, a stress can occur not just on account of a temperature change, but rather can for example also occur in the event of a mechanical effect on the sensor apparatus 300, 400, for example in the event of a vibration, an impact, a mechanical deformation of the housing 104, or the like.

In various embodiments, this stress, too, can be reduced or prevented in the chip by the terminals 106a, 106b embodied in a resilient fashion.

In various embodiments, it is thus possible to provide a stress-free or at least low-stress mounting of the sensor chip 102.

Since the metal carrier structure 106, e.g. with its electrical terminals 106a, 106b, extends into the cavity through the two mutually opposite sidewalls 105 of the housing 104, the sensor chip 102 can be mounted on the electrical terminals 106a, 106b such that a mechanical force action, for example—as described above—as a result of a temperature change, an impact or the like, exerts on the electrical terminals 106a and 106b forces that are substantially equal in magnitude but act in opposite directions. In an illustrative description, by way of example, a change in length of the electrical terminals 106a, 106b, and/or of the housing 104 and/or of the chip can lead to a, for example elastic, deformation of the electrical terminals 106a, 106b. The electrical terminal 106a can extend between one sidewall 105 and one contact 112 from the plurality of contacts 112 of the sensor chip 102, which contact is arranged near a side surface of the sensor chip 102 which faces the sidewall 105 of the housing 104. The electrical terminal 106b can extend between the opposite sidewall 105 and another contact 112 from the plurality of contacts 112 of the sensor chip 102, which contact is arranged near a side surface of the sensor chip 102 which faces the opposite sidewall 105 of the housing 104. The substantially equal forces having opposite directions which act on the electrical terminals 106a, 106b can mutually cancel one another out, such that the sensor chip 102 can substantially remain in its position despite the deformation of the electrical terminals 106a, 106b.

To put it another way, in various embodiments, by a mounting of the sensor chip 102 on the mutually opposite electrical terminals 106a, 106b of the metal carrier structure 106, the sensor chip 102 can be mounted such that e.g. a change in the temperature of the sensor apparatus 300, 400 does not generate any force directed at displacing the sensor chip 102 relative to a medium surrounding it, for example air or silicone. In an illustrative description, in the event of a change in temperature, as a result of a change in length of the electrical terminals 106a, 106b of the metal carrier structure 106 and of the sensor chip 102, a force can be exerted on the sensor chip 102 in the direction of the longitudinal axis of the electrical terminals 106a, 106b. However, since a force in an opposite direction is exerted on the sensor chip 102 from the opposite side, the two forces directed toward one another mutually cancel one another out, and a position of the sensor chip 102 remains substantially unchanged.

In various embodiments, the metal carrier structure 106, for example the electrical terminals 106a, 106b, can be embodied in a resilient fashion along at least one further direction, for example substantially perpendicular to the longitudinal axis and substantially parallel to the base 103 of the housing 104, or substantially perpendicular to the longitudinal axis and substantially perpendicular to the base 103.

In various embodiments, the metal carrier structure 106 can be embodied such that a resilient structure 322 (see e.g. FIG. 3A), i.e. a structure 322 having spring action, is formed between an entry point of the electrical terminal 106a, 106b into the cavity and the contact region of the electrical terminal 106a, 106b with the contact 112 of the sensor chip 102.

In various embodiments, the sensor apparatus 300, 400 may include a filling material 114. The filling material 114 can be filled into the cavity. The filling material 114 can be elastic, for example silicone.

In various embodiments, the filling material 114 can be designed to protect the sensor chip 102 against harmful influences, for example against corrosion as a result of the ingress of moisture (air humidity), against mechanical damage or the like. The filling material 114 can be introduced into the cavity such that the sensor chip 102 is substantially encapsulated. By way of example, the filling material 114 can be introduced into the cavity such that from the base 103 of the housing 104 it fills the cavity as far as above the main surface 102b facing away from the base 103.

In various embodiments, for example if no filling material 114 is introduced into the cavity, the sensor device 102, the electrical terminals 106a, 106b, the contacts 112 and/or the adhesive 116 can be protected in a different way, for example against corrosion. By way of example, a protective layer (not illustrated) can be applied. The protective layer may include for example a polymer, for example parylene. The protective layer can be applied by plasma coating, for example.

In various embodiments, the sensor apparatus 400, as illustrated in FIG. 2B, may include a spacer 220.

In various embodiments, the spacer 220 can be arranged between a partial region of the metal carrier structure 106, for example the electrical terminals 106a, 106b and the base 103 of the housing 104. In a case where the base 103 of the housing has not yet been formed, the spacer 220 can be arranged between the partial region of the metal carrier structure 106 and a region in which the base 103 of the housing 104 is intended to be formed.

Given an orientation of the sensor apparatus 400 as illustrated in FIG. 2B, the spacer 220 can be arranged below the electrical terminals 106a, 106b.

In various embodiments, the spacer 220 can be arranged before the housing 104 is injection-molded. The spacer can be arranged between an underside of the metal carrier structure 106, i.e. a side of the metal carrier structure 106 facing a base 103 to be formed of the housing 104, and the base 103 to be formed. The spacer 220 can make it possible to close an injection-molding mold prior to injection molding. In an illustrative description, the spacer 220 can be utilized to form a part of a mold for injection molding between the base 103 to be formed of the housing 104 and the resilient electrical terminals 106a, 106b of the metal carrier structure 106. This enables the housing 104 to be injection-molded without the electrical terminals 106a, 106b of the metal carrier structure 106 being embedded into the base 103 of the housing 104 and/or bearing thereon and/or adhering thereto.

The spacer 220 may include any material which makes it possible that the housing 104 can be formed without the electrical terminals 106a, 106b being rigidly connected to the base 103 of the housing 104. In various embodiments, the spacer 220 may include or be formed from a flexible material, for example a nonwoven, a flexible substrate, a polyimide lamina.

The spacer 220 may include a material which is removable again after the injection molding of the housing 104 and, if appropriate, after solidification of the housing 104. The spacer 220 can be removable for example mechanically, for example by extraction, e.g. using tweezers. The spacer 220 can be removable for example galvanically, for example by dissolution. The spacer 220 can be removed for example from a direction of the cavity or from a direction of the opening 118.

The spacer 220 can remain in the sensor apparatus 400 after injection molding, provided that the electrical terminals 106a, 106b of the metal carrier structure 106 are movable relative to the base 103 of the housing 104 despite the spacer 220 remaining, for example resiliently movable along their longitudinal axis, for example elastically deformable.

If the sensor apparatus 400 has an opening 118 in the base 103 of the housing 104, the spacer 220 can be provided with an opening (not illustrated). The spacer 220 can be arranged such that its opening forms a continuation of the opening 118.

The spacer 220 can be embodied as a film on the underside of the metal carrier structure 106. The film may include a material which does not adhere to the material of the housing 104, even if it comes into contact with the liquefied material of the housing 104, for example wax. The mold for injection molding can be embodied so as to result in a substantially planar inner surface of the base 103 of the housing 104. The film on the underside of the metal carrier structure 106 can have the effect that the electrical terminal 106a, 106b of the metal carrier structure 106 is movable relative to the base of the housing, for example resiliently movable along its longitudinal axis. The electrical terminals 106a, 106b of the metal carrier structure 106 can have the spring action at least in the direction of their longitudinal axis.

The spacer 220 can have a thickness in a range of approximately 1 nm to approximately 1 mm, for example in a range of approximately 1 nm to approximately 200 nm or for example in a range of approximately 50 µm to approximately 1 mm.

Figure 3A:
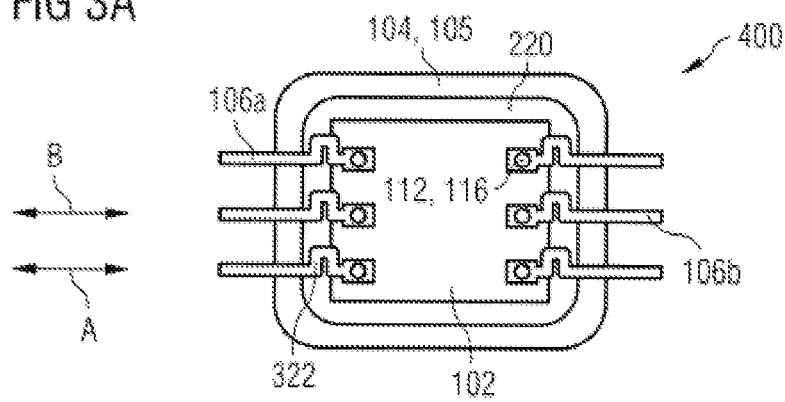
FIGS. 3A to 3C show plan views of sensor apparatuses in accordance with various embodiments.
Figure 3B:
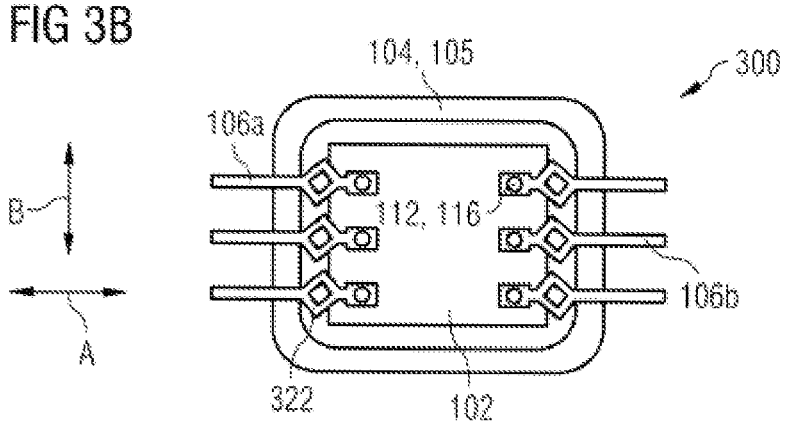
Figure 3C:
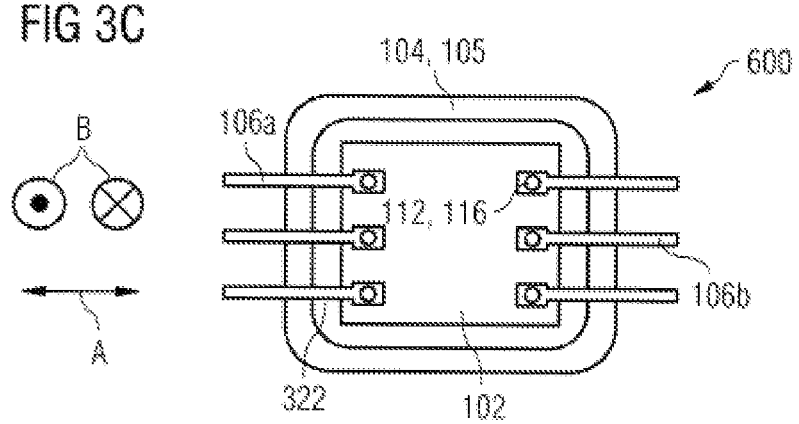

FIG. 3A, FIG. 3B and FIG. 3C show plan views of sensor apparatuses 300, 400, 600 in accordance with various embodiments.

The sensor apparatuses 300, 400, 600 and their parts, e.g. housing 104, metal carrier structure 106, sensor chip 102, contacts 112, etc., can substantially correspond to the sensor apparatuses 300, 400 and their parts described in FIG. 2A and FIG. 2B, and so a renewed description is omitted.

The resilient structure 322 can be embodied in a specific geometry, for example as a meandering shape 322 as illustrated in FIG. 3A, or as a branching and recombining structure 322 as illustrated in FIG. 3B, to put it another way as a structure 322 having an opening.

The resilient structure 322 can be embodied in a plane, for example in a principal plane of the metal carrier structure 106.

The resilient structure 322, as illustrated in FIG. 3A and FIG. 3B, can deform, for example elastically, such that the deformation takes place substantially in a direction which lies within the plane of the metal carrier structure 106. The direction in which a deformation of the resilient structures 322 substantially takes place in FIG. 3A to FIG. 3C is identified in each case by an arrow B, the arrow being illustrated in a manner shifted parallel with respect to the resilient structures 322, for the sake of better clarity. A direction along the longitudinal axes of the electrical terminals 106a, 106b of the metal carrier structure 106 in which a spring action at least takes place is identified in each case by a parallel-shifted arrow A. In FIG. 3A, the deformation can take place substantially within the plane of the metal carrier structure 106 and substantially parallel to the direction of the spring action. In FIG. 3B, the deformation can take place substantially within the plane of the metal carrier structure 106 and substantially perpendicular to the direction of the spring action.

The resilient structure 322, as illustrated in FIG. 3C, can deform, for example elastically, such that the deformation takes place in a direction which lies substantially in a different plane than the plane of the metal carrier structure 106. In FIG. 3C, an arrow B extending into a plane of the drawing and out of said plane, which arrow symbolizes the deformation direction, is symbolized as dotted and crossed circle. The resilient structure 322 can deform for example in a direction which is substantially perpendicular to the plane of the metal carrier structure 106. As a result of that, the resilient structure is not discernible as such in FIG. 3C; it is illustrated as a perspective view in FIG. 4B.

The electrical terminal 106a, 106b and its resilient structure 322 can be embodied, for example by a connection that is stiff in one direction, for example a ribbing (not illustrated), such that a deformation of the electrical terminal or a movement of the sensor chip 102 in this direction is prevented.

FIG. 4A and FIG. 4B show perspective detail views of the sensor apparatuses 400 and 600 respectively illustrated in FIG. 3A and FIG. 3C. FIG. 4C shows a perspective detail view of a further sensor apparatus 500.

In various embodiments, the metal carrier structure 106, for example the electrical terminals 106a, 106b, by the resilient structure 322, besides the spring action in the direction of the longitudinal axes of the electrical terminals 106a, 106b, illustrated as direction A and associated direction of the deformation B, can also have an additional spring action in other directions, for example in directions perpendicular to the direction A.

As is illustrated in FIG. 4A and in FIG. 4C, in various embodiments, the additional spring action can act for example in a direction A3 lying in the plane of the metal carrier structure 106, by an associated deformation direction B3, or in a direction A2 perpendicular to the plane of the metal carrier structure 106, by an associated deformation direction B2.

In the case of the metal carrier structure in accordance with FIG. 4A, the spring action along the direction A can be provided for example by virtue of the fact that the resilient structure 322, in this case a meandering structure 322, in the event of a compression and/or in the event of an expansion of the metal carrier structure 106 in the direction of the longitudinal axes of the electrical terminals 106a, 106b, deforms, e.g. bends, in a deformation direction B substantially parallel thereto. By way of example, parts of the meandering structure which extend in the plane of the metal carrier structure 106 in a different direction than the direction A, for example approximately perpendicular thereto, can deform in the deformation direction B such that a distance formed between a region of the electrical terminal 106a, 106b which is mounted on the sidewall (not illustrated here, see e.g. FIG. 2B) and a region of the electrical terminal 106a, 106b which is mounted on the sensor device 102 decreases in the event of a compression of the electrical terminal 106a, 106b and increases in the event of an expansion of the electrical terminal 106a, 106b.

In the case of the metal carrier structure in accordance with FIG. 4B, the spring action along the direction A can be provided for example by virtue of the fact that the resilient structure 322, in this case a region 322 projecting, e.g. kinked, out of the plane of the metal carrier structure 106 in a direction substantially perpendicular to the direction A, in the event of a compression and/or an expansion of the metal carrier structure 106 in the direction of the longitudinal axes of the electrical terminals 106a, 106b, deforms, e.g. bends, out of the plane of the metal carrier structure 106 in the deformation direction B substantially perpendicular thereto. By way of example, in the event of a compression in the direction of the longitudinal axes of the electrical terminals 106a, 106b, the kink of the projecting region 322 can be amplified, such that the region of the electrical terminal 106a, 106b which is mounted on the sidewall and the region of the electrical terminal 106a, 106b which is mounted on the sensor device 102 approach one another. Conversely, in the case of an expansion in the direction of the longitudinal axes of the electrical terminals 106a, 106b, the kink of the projecting region 322 can be flattened, and the region of the electrical terminal 106a, 106b which is mounted on the sensor device 102 can move away from the region of the electrical terminal 106a, 106b which is mounted on the sidewall.

In the case of the metal carrier structure in accordance with FIG. 4C, the spring action along the direction A can be provided for example by virtue of the fact that the resilient structure 322, in this case a tapered region 322, in the case of a compression of the metal carrier structure 106 in the direction of the longitudinal axes of the electrical terminals 106a, 106b, deforms, e.g. bends, out of the plane of the metal carrier structure 106 in the deformation direction B substantially perpendicular thereto. As a result, the region of the electrical terminal 106a, 106b which is mounted on the sidewall and the region of the electrical terminal 106a, 106b which is mounted on the sensor device 102 can approach one another.

As is illustrated in FIG. 4B, in various embodiments, the additional spring action can act for example in a direction A2 perpendicular to the plane of the metal carrier structure 106 by an associated deformation direction B2.

FIG. 5 shows a flow chart 5000 illustrating a method for producing a sensor apparatus.

In various embodiments, a method for producing a sensor apparatus may include arranging a spacer above a metal carrier structure (in 5010); forming a housing around a part of the metal carrier structure and the spacer in such a way that the metal carrier structure extends into the housing in a manner passing through two mutually opposite sidewalls from the plurality of sidewalls, wherein the metal carrier structure is embodied in a resilient fashion at least in the direction of a sidewall through which the metal carrier structure extends (in 5020); resiliently mounting a sensor device, which has a plurality of electrical contacts, on the metal carrier structure by the electrical contacts (in 5030); and electrically conductively connecting the sensor device to the metal carrier structure by the plurality of contacts (in 5040).

The spacer arranged above the metal carrier structure can be arranged between a base of the housing and the metal carrier structure after the process of forming the housing (see FIG. 2B), that is to say below the metal carrier structure in FIG. 2B.

Further advantageous configurations of the method are evident from the descriptions of the sensor apparatus, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A sensor apparatus, comprising:
a sensor device having a plurality of electrical contacts;
a housing having a plurality of sidewalls and a base;
a metal carrier structure, which extends into the plurality of sidewalls above the base and into the housing in a manner passing through two mutually opposite sidewalls from the plurality of sidewalls;
wherein the metal carrier structure is spring-like at least in a direction of a sidewall of the mutually opposite sidewalls through which the metal carrier structure extends; and
wherein the sensor device having the plurality of electrical contacts is mounted in a resilient fashion on the metal carrier structure and is electrically conductively connected to the metal carrier structure by the plurality of contacts.

2. The sensor apparatus of claim 1,
wherein the metal carrier structure is a meandering spring structure embodied in a plane of the metal carrier structure.

3. The sensor apparatus of claim 1,
wherein the metal carrier structure is a spring structure embodied as an opening in a plane of the metal carrier structure.

4. The sensor apparatus of claim 2,
wherein the spring structure is embodied between the respective sidewall and a respective contact region of the metal carrier structure with the electrical contact.

5. The sensor apparatus of claim 1,
wherein the sensor device has a pressure sensor.

6. The sensor apparatus of claim 1, further comprising:
a filling material arranged such that it encapsulates the sensor.

7. The sensor apparatus of claim 6,
wherein the filling material is elastic.

8. The sensor apparatus of claim 6,
wherein the filling material comprises silicone.

9. The sensor apparatus of claim 1,
wherein the housing is injection-molded.

10. The sensor apparatus of claim 1, further comprising:
a spacer, wherein the spacer is arranged between the metal carrier structure and the base of the housing.

11. The sensor apparatus of claim 10,
wherein the metal structure is movable relative to the spacer.

12. A method for producing a sensor apparatus, the method comprising:
arranging a spacer on a metal carrier structure;
forming a housing having a base below the metal carrier structure and a plurality of sidewalls around a part of the metal carrier structure and the spacer in such a way that the metal carrier structure extends into the housing in a manner passing through two mutually opposite sidewalls from the plurality of sidewalls,
wherein the spacer is between the metal carrier structure and the base of the housing;
wherein the metal carrier structure extends into the plurality of sidewalls above the base;
wherein the metal carrier structure is spring-like at least in a direction of a sidewall of the mutually opposite sidewalls through which the metal carrier structure extends;
resiliently mounting a sensor device, which has a plurality of electrical contacts, on the metal carrier structure by the electrical contacts; and
electrically conductively connecting the sensor device to the metal carrier structure by the plurality of electrical contacts.

13. The method apparatus of claim 12,
wherein forming the housing comprises injection molding.

14. The method apparatus of claim 12, further comprising:
removing the spacer.

15. The method apparatus of claim 12, further comprising:
arranging a filling material.

16. The method apparatus of claim 12,
wherein arranging the filling material comprises introducing liquid silicone by filling.

17. The method apparatus of claim 12,
wherein electrically conductively connecting the sensor device to the metal carrier structure comprises soldering the plurality of electrical contacts onto the metal carrier structure.

18. The sensor apparatus of claim 3,
wherein the spring structure is embodied between the respective sidewall and a respective contact region of the metal carrier structure with the electrical contact.

19. A sensor apparatus, comprising:
a sensor device having a plurality of electrical contacts;
a housing having a plurality of sidewalls and a base;
a metal carrier structure, which extends into the plurality of sidewalls above the base and into the housing in a manner passing through two mutually opposite sidewalls from the plurality of sidewalls;
wherein the metal carrier structure is independently spring-like at least in a direction of a sidewall of the mutually opposite sidewalls through which the metal carrier structure extends; and
wherein the sensor device having the plurality of electrical contacts is mounted in a resilient fashion on the metal carrier structure and is electrically conductively connected to the metal carrier structure by the plurality of contacts.

* * * * *